(12) United States Patent
Kainuma

(10) Patent No.: US 12,532,589 B2
(45) Date of Patent: Jan. 20, 2026

(54) HEADER FOR SEMICONDUCTOR PACKAGE, AND SEMICONDUCTOR PACKAGE

(71) Applicant: SHINKO ELECTRIC INDUSTRIES CO., LTD., Nagano (JP)

(72) Inventor: Masao Kainuma, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 754 days.

(21) Appl. No.: 17/806,572

(22) Filed: Jun. 13, 2022

(65) Prior Publication Data

US 2022/0416142 A1    Dec. 29, 2022

(30) Foreign Application Priority Data

Jun. 29, 2021  (JP) ................................ 2021-107468

(51) Int. Cl.
*H01L 23/045*    (2006.01)
*H01L 23/12*     (2006.01)
(Continued)

(52) U.S. Cl.
CPC ....... *H10H 20/8585* (2025.01); *H01L 23/045* (2013.01); *H01L 23/12* (2013.01); *H01L 23/38* (2013.01); *H10H 20/857* (2025.01)

(58) Field of Classification Search
CPC ..... H01L 23/38; H01L 23/12; H01L 23/3731; H01L 23/3677; H01L 23/3736; H01L 23/045; H01L 23/49827
See application file for complete search history.

(56) References Cited

U.S. PATENT DOCUMENTS 6,376,782 B1    4/2002 Kimura et al.
6,855,631 B2 *  2/2005 Kirby ................ H01L 21/76873
                                             257/E21.585
(Continued)

FOREIGN PATENT DOCUMENTS

CN    112997371    6/2021
EP     0871220    10/1998
(Continued)

OTHER PUBLICATIONS

English Translation of JP 2019-186380A, 9 pages (Year: 2019).*
(Continued)

*Primary Examiner* — Phat X Cao
(74) *Attorney, Agent, or Firm* — IPUSA, PLLC

(57) ABSTRACT

A header for a semiconductor package, includes an eyelet having a through hole penetrating the eyelet from an upper surface to a lower surface of the eyelet, a first lead inserted inside the through hole, and an insulating substrate disposed on the upper surface of the eyelet, and provided with a first through hole at a position overlapping one end of the first lead in a plan view. The insulating substrate has a thermal conductivity lower than a thermal conductivity of the first lead. A first conductive layer is formed on an inner wall defining the first through hole, and the first conductive layer extends to an upper surface of the insulating substrate. The one end of the first lead is electrically connected to the first conductive layer, and a space is provided above the one end of the first lead inside the first through hole.

20 Claims, 10 Drawing Sheets

(51) Int. Cl.
    *H01L 23/38*     (2006.01)
    *H10H 20/857*     (2025.01)
    *H10H 20/858*     (2025.01)

(56)     References Cited

U.S. PATENT DOCUMENTS

| | | | |
|---|---|---|---|
| 11,088,096 B2 * | 8/2021 | Aowudomsuk | ........ H05K 1/189 |
| 2008/0067665 A1 | 3/2008 | Aziz et al. | |
| 2012/0045161 A1 | 2/2012 | Okada | |
| 2017/0310078 A1 | 10/2017 | Hirayama | |
| 2020/0303330 A1 | 9/2020 | Lin et al. | |
| 2021/0257808 A1 | 8/2021 | Otani et al. | |

FOREIGN PATENT DOCUMENTS

| | | |
|---|---|---|
| JP | S62-257754 | 11/1987 |
| JP | S62-257755 | 11/1987 |
| JP | 2012-160484 | 8/2012 |
| JP | 2017-212252 | 11/2017 |
| JP | 2019-186380 | 10/2019 |
| JP | 2019186380 A * | 10/2019 |

OTHER PUBLICATIONS

Extended European Search Report dated Apr. 4, 2023 with respect to the corresponding European patent application No. 22179286.4.
Partial European Search Report dated Dec. 5, 2022 issued with respect to the corresponding European Patent Application No. 22179286.4.

* cited by examiner

HEADER FOR SEMICONDUCTOR PACKAGE, AND SEMICONDUCTOR PACKAGE

CROSS-REFERENCE TO RELATED APPLICATIONS

This application is based upon and claims priority to Japanese Patent Application No. 2021-107468, filed on Jun. 29, 2021, the entire contents of which are incorporated herein by reference.

FIELD

Certain aspects of the embodiments discussed herein are related to headers for semiconductor packages, and semiconductor packages. The header may sometimes also be referred to as a stem.

BACKGROUND

In a semiconductor package provided with a light emitting element, a cooling element for temperature adjustment is provided in a case where an amount of heat generated from the light emitting element is large. In this case, the light emitting element may be provided on a device mounting insulating substrate disposed on the cooling element.

In the semiconductor package having the configuration described above, a transmission line length from a signal lead to the light emitting element becomes long because the cooling element is relatively thick, and a predetermined characteristic impedance may not be obtainable in some cases. In addition, in order to reduce a decrease in cooling efficiency, considerations need to be taken so that the heat of the light emitting element, transferred by the provision of the cooling element, will not be returned toward the light emitting element.

Accordingly, in a header for the semiconductor package that can be provided with the light emitting device and the cooling element, considerations also need to be taken so that the configuration of the header enables the desired characteristic impedance and cooling performance of the semiconductor package to be obtained.

An example of related art is proposed in Japanese Laid-Open Patent Publication No. 2017-212252 (now Japanese Patent No. 6,794,140).

SUMMARY

Accordingly, it is an object in one aspect of the embodiments to provide a header for a semiconductor package, having a configuration that takes into consideration the characteristic impedance and cooling performance of the semiconductor package.

According to one aspect of the embodiments, a header for a semiconductor package, includes an eyelet having a through hole penetrating the eyelet from an upper surface to a lower surface of the eyelet; a first lead inserted inside the through hole; and an insulating substrate disposed on the upper surface of the eyelet, and provided with a first through hole at a position overlapping one end of the first lead in a plan view, wherein the insulating substrate has a thermal conductivity lower than a thermal conductivity of the first lead, a first conductive layer is formed on an inner wall defining the first through hole, and the first conductive layer extends to an upper surface of the insulating substrate, the one end of the first lead is electrically connected to the first conductive layer, and a space is provided above the one end of the first lead inside the first through hole.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
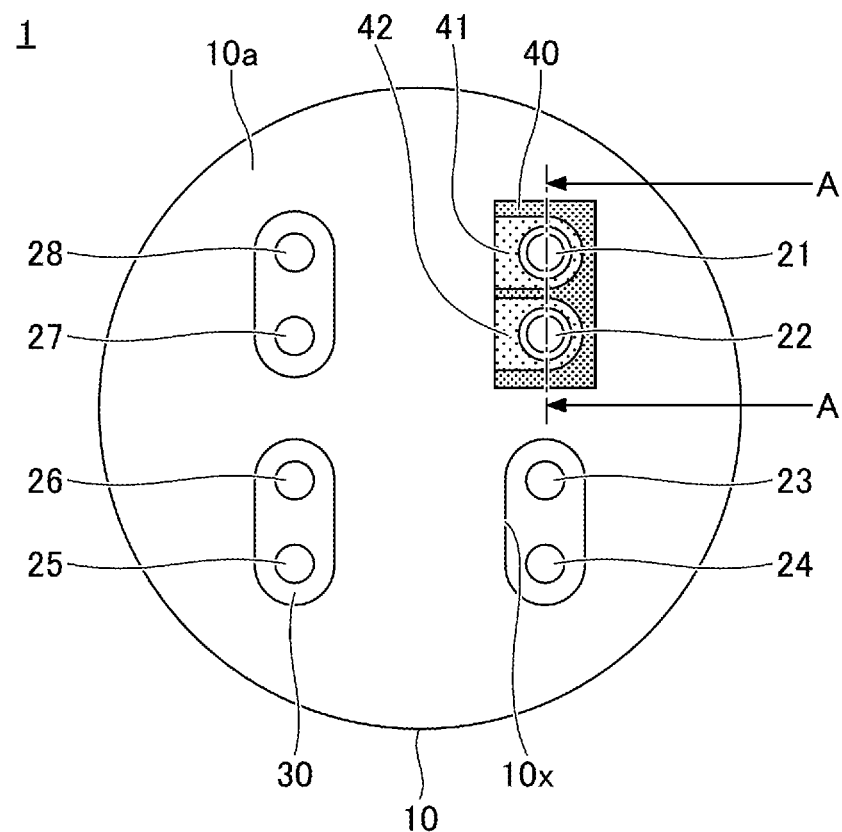
FIG. 1A and FIG. 1B are diagrams illustrating an example of a header for a semiconductor package according to a first embodiment.

Preferred embodiments of the present invention will be described with reference to the accompanying drawings. In the drawings, those parts that are the same are designated by the same reference numerals, and a repeated description of the same parts may be omitted.

A description will now be given of a header for a semiconductor package, and a semiconductor package, according to each embodiment of the present invention.

First Embodiment

Figure 1B:
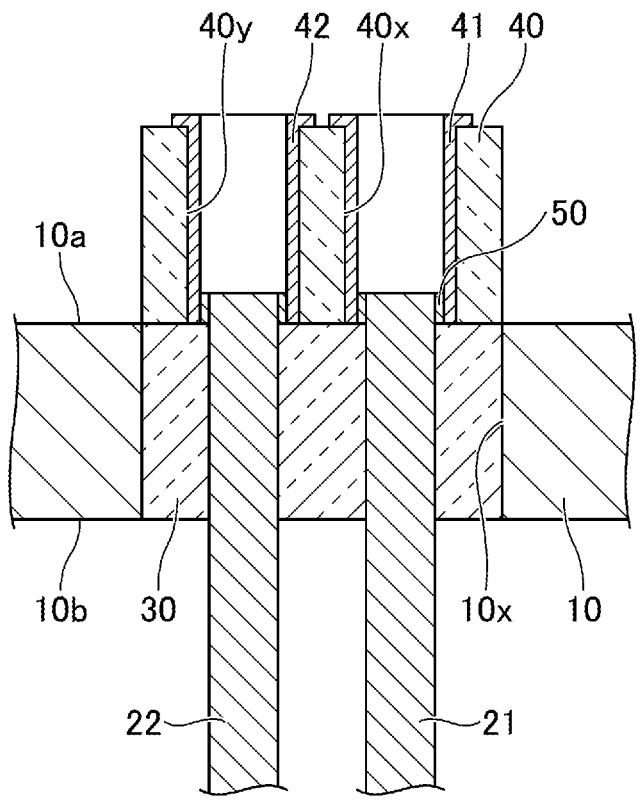

FIG. 1A and FIG. 1B are diagrams illustrating an example of a header for a semiconductor package according to a first embodiment. FIG. 1A is a plan view of the header, and FIG. 1B is a partial cross sectional view of the header along a line A-A in FIG. 1A.

As illustrated in FIG. 1A and FIG. 1B, a header 1 for a semiconductor package (hereinafter also referred to as a semiconductor package header 1) according to the first embodiment includes an eyelet 10, a first lead 21, a second lead 22, a third lead 23, a fourth lead 24, a fifth lead 25, a sixth lead 26, a seventh lead 27, an eighth lead 28, a seal 30, and an insulating substrate 40. The semiconductor package header 1 can be used as a header for optical communication, for example.

When it is not necessary to distinguish the first lead 21, the second lead 22, the third lead 23, the fourth lead 24, the fifth lead 25, the sixth lead 26, the seventh lead 27, and the eighth lead 28 from one another, each of the first through eighth leads 21 through 28 may simply be referred to as a lead.

The eyelet 10 is a disk shaped member. A diameter of the eyelet 10 is not particularly limited, and can be appropriately determined according to purpose thereof, and can be 3.8 mm, 5.6 mm, or the like, for example. A thickness of the eyelet 10 is not particularly limited, and can be appropriately determined according to purpose thereof, and can be in a range of approximately 1.0 mm to approximately 1.5 mm, for example. The eyelet can be formed of a metallic material, such as iron or the like, for example. The eyelet 10 can be formed of a metallic material (for example, a so-called cladding material) in which a plurality of metal layers (for example, copper layers, iron layers, or the like) are laminated. A gold plating or the like can be provided on a surface of the eyelet 10.

In the present specification, the term "disk shaped member" refers to a member having a planar shape that is approximately circular and having a predetermined thickness. The thickness relative to the diameter of the disk shaped member is not particularly limited, and can be small or large. The disk shaped member can include a concave portion, a convex portion, a through hole, or the like famed in a portion thereof. In the present specification, a plan view of an object refers to a view of the object in a normal direction to an upper surface 10a of the eyelet 10, and a planar shape of the object refers to a shape of the object in the plan view viewed in the normal direction to the upper surface 10a of the eyelet 10.

One or more cutouts having a shape recessed from an outer periphery towards a center of the eyelet 10 in the plan view, can be formed at an outer edge of the eyelet 10. The cutout can be a recess having a planar shape that is generally triangular or generally rectangular, for example. The cutout can be used for positioning or the like of a device mounting surface when mounting a semiconductor device on the semiconductor package header 1, for example. In addition, the cutout can be used for positioning or the like of a rotating direction of the semiconductor package header 1, for example.

Each lead is inserted into a through hole 10x that penetrates the eyelet 10 from the upper surface 10a to a lower surface 10b thereof, in a state where a longitudinal direction of each lead penetrates a thickness direction of the eyelet 10, and a periphery of each lead is sealed by the seal 30. The seal 30 is made of an insulating material, such as glass or the like, for example. The glass can be soft glass, typified by soft glass having a relative dielectric constant of approximately 6.7, for example. A single lead can be disposed inside one through hole 10x, or multiple leads can be disposed inside one through hole 10x. In the example illustrated in FIG. 1A and FIG. 1B, two leads are disposed inside one through hole 10x.

A portion of each of the first lead 21 and the second lead 22 protrudes upward from the upper surface 10a of the eyelet 10. A protruding amount of each of the first lead 21 and the second lead 22 can be in a range of approximately 0.1 mm to approximately 0.3 mm, for example. Leads other than the first lead 21 and the second lead 22 can also protrude upward from the upper surface 10a of the eyelet 10, as required. Each lead protrudes downward from the lower surface 10b of the eyelet 10. A protruding amount of each lead from the lower surface 10b of the eyelet 10 can be in a range of approximately 6 mm to approximately 10 mm, for example. Each lead can be formed of a metal, such as iron nickel alloy, kovar, or the like, for example, and a gold plating or the like can be provided on a surface of each lead.

The first lead 21 and the second lead 22 are disposed adjacent to each other, and provide a path for differential signaling electrically connected to a light emitting element, when mounting the light emitting element on the semiconductor package header 1 for use as the semiconductor package. The leads other than the first lead 21 and the second lead 22 provide a path for a ground GND, a signal path electrically connected to a cooling element mounted on the semiconductor package header 1, a signal path electrically connected to a temperature sensor mounted on the semiconductor package header 1, or the like, for example. The number of leads is not particularly limited, and can be increased or decreased, as required.

The insulating substrate 40 is disposed on the upper surface 10a of the eyelet 10. The insulating substrate 40 is bonded to the upper surface 10a of the eyelet 10 using gold tin (AnSn) solder, silver paste, or the like, for example. The insulating substrate 40 is formed of a material having a thermal conductivity lower than a thermal conductivity of a material forming each lead. More particularly, a glass substrate is preferably used as the insulating substrate 40. Examples of glass forming the glass substrate include alkali-free glass, quartz glass, soda lime glass, borosilicate glass, or the like, for example.

The insulating substrate 40 can have a parallelepiped shape, for example. A height of the insulating substrate 40 with reference to the upper surface 10a of the eyelet 10 can be in a range of approximately 1 mm to approximately 2 mm, for example. The insulating substrate 40 has a first through hole 40x at a position overlapping one end of the first lead 21 in the plan view. The insulating substrate 40 has a second through hole 40y at a position overlapping one end of the second lead 22 in the plan view. The first through hole 40x and the second through hole 40y are provided in a direction parallel to the longitudinal direction of the first lead 21 and the second lead 22.

A first conductive layer 41 is formed on an inner wall defining the first through hole 40x, and the first conductive layer 41 extends to an upper surface of the insulating substrate 40. In addition, a second conductive layer 42 is formed on an inner wall defining the second through hole 40y, and the second conductive layer 42 extends to the upper surface of the insulating substrate 40. The first conductive layer 41 and the second conductive layer 42 can be formed of titanium, copper, nickel, gold, or the like, for example.

The planar shapes of the first through hole 40x and the second through hole 40y are circular, for example. An inside diameter of the first through hole 40x is determined to a value that enables insertion of the first lead 21 into the first through hole 40x. Moreover, an inside diameter of the second through hole 40y is determined to a value that enables insertion of the second lead 22 into the second through hole 40y. For example, in a case where a diameter of the first lead 21 and the second lead 22 is 0.3 mm, the inside diameter of the first through hole 40x and the second through hole 40y can be 0.45 mm.

One end of the first lead 21 protrudes from the upper surface 10a of the eyelet 10, and is inserted into the first through hole 40x. This one end of the first lead 21 is electrically connected to the first conductive layer 41, via a conductive bonding material 50. One end of the second lead 22 protrudes from the upper surface 10a of the eyelet 10, and is inserted into the second through hole 40y. This one end of the second lead 22 is electrically connected to the second conductive layer 42, via the conductive bonding material 50. The conductive bonding material 50 can be solder (for example, gold tin alloy), a conductive paste (for example, silver paste), or the like, for example. A space is provided above the one end of the first lead 21 inside the first through hole 40x. Further, a space is provided above the one end of the second lead 22 inside the second through hole 40y.

Figure 2A:
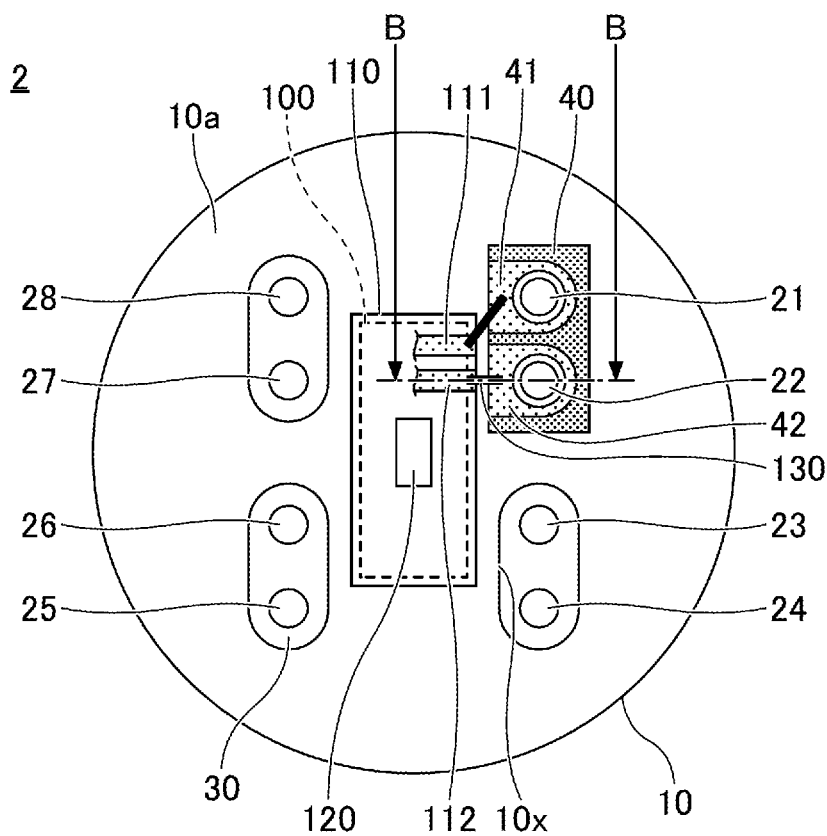
FIG. 2A and FIG. 2B are diagrams illustrating an example of a semiconductor package according to the first embodiment.
Figure 2B:
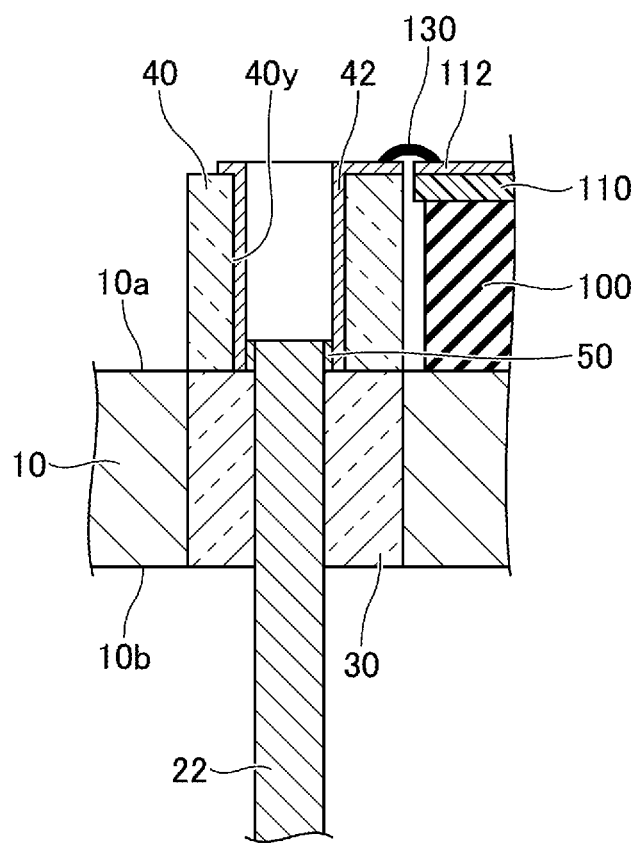

FIG. 2A and FIG. 2B are diagrams illustrating an example of a semiconductor package according to the first embodiment. FIG. 2A is a plan view of the semiconductor package, and FIG. 2B is a partial cross sectional view of the semiconductor package along a line B-B in FIG. 2A.

As illustrated in FIG. 2A and FIG. 2B, the semiconductor package 2 according to the first embodiment includes the semiconductor package header 1 (refer to FIG. 1A and FIG. 1B), a cooling element 100, a device mounting substrate 110 to be mounted with devices, and a light emitting element 120. In the semiconductor package 2, a cap, integrally including a lens, a window, or the like for extracting light emitted from the light emitting element 120, is fixed to the semiconductor package header 1 by resistance welding or the like. However, because such a configuration of the cap is a well known, an illustration of the cap will be omitted. The cap is formed of a metal, such as stainless steel or the like, for example, and the cap provides an airtight seal for main components, such as the light emitting element 120 or the like of the semiconductor package header 1 inside the cap.

The cooling element 100 is disposed on the upper surface 10a of the eyelet 10. The cooling element 100 is fixed to the upper surface 10a of the eyelet 10 by a bonding agent or the like having a high thermal conductivity, for example, at a position near the center of the eyelet 10. The cooling element 100 cools the light emitting element 120 which generates heat when emitting light, and can be a Peltier element, for example. A cooling capacity of the cooling element 100 is adjusted by varying an external voltage applied to the cooling element 100.

The device mounting substrate 110 is disposed on the cooling element 100. The device mounting substrate 110 is fixed to the cooling element 100 by a bonding agent or the like having a high thermal conductivity, for example. The light emitting element 120 is mounted on the device mounting substrate 110. The light emitting element 120 can be a semiconductor laser chip that emits light having a wavelength of 1310 nm or the like, for example.

Interconnects 111 and 112, electrically connected to terminals of the light emitting element 120, are formed on the device mounting substrate 110. In FIG. 2A and FIG. 2B, illustration of a portion of the interconnects 111 and 112 is omitted. The interconnects 111 and 112 extend to positions near the insulating substrate 40 on the device mounting substrate 110. The interconnect 111 is electrically connected to a portion of the first conductive layer 41 extending to the upper surface of the insulating substrate 40, via a wire member 130. In addition, the interconnect 112 is electrically connected to a portion of the second conductive layer 42 extending to the upper surface of the insulating substrate 40, via the wire member 130. Examples of the wire member 130 include a bonding wire or the like, for example. However, the wire member 130 is not particularly limited, as long as the wire member 130 is a wire (or line) shaped member.

The interconnects 111 and 112 are differential signaling interconnects. For example, a positive phase signal is input to the interconnect 111, via the first lead 21, the conductive bonding material 50, the first conductive layer 41, and the wire member 130. In addition, a inverted phase signal, obtained by inverting the positive phase signal, is input to the interconnect 112, via the second lead 22, the conductive bonding material 50, the second conductive layer 42, and the wire member 130.

The semiconductor package header 1 has a configuration that takes into consideration the characteristic impedance and the cooling performance of the semiconductor package that is formed using the semiconductor package header 1. This configuration will be described below with reference to FIG. 3A through FIG. 7, or the like.

Figure 3A:
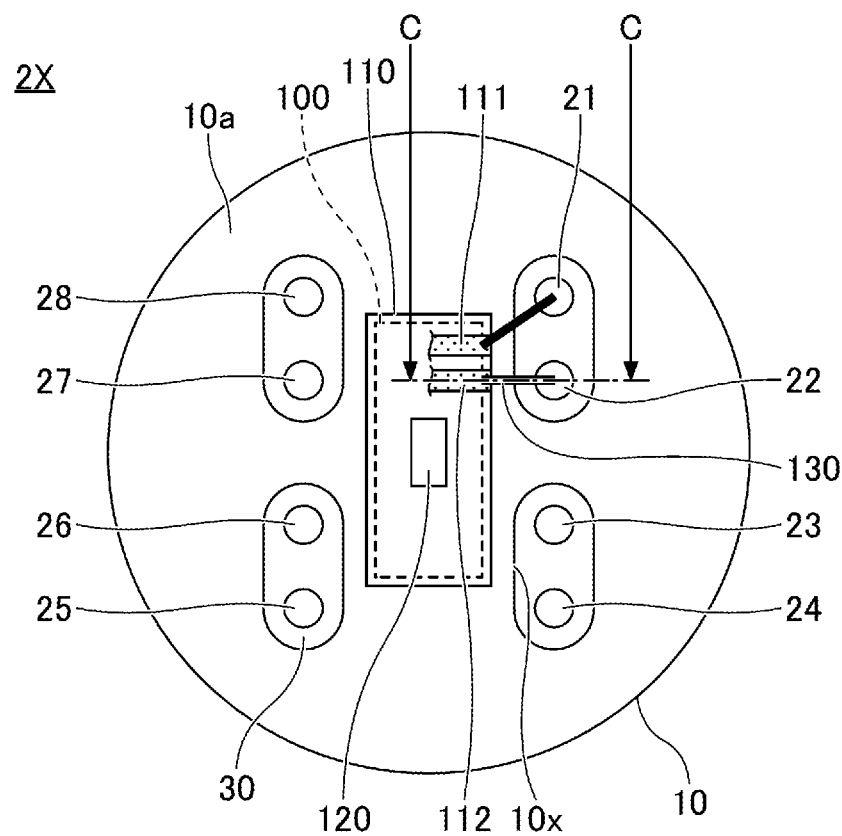
FIG. 3A and FIG. 3B are diagrams illustrating an example of a semiconductor package according to a comparative example.
Figure 3B:
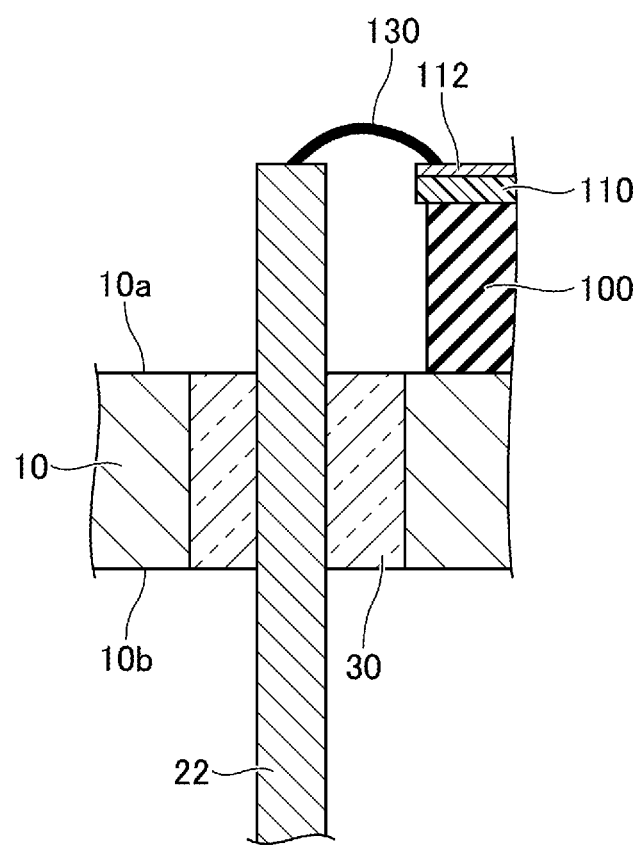

FIG. 3A and FIG. 3B are diagrams illustrating an example a semiconductor package according to a comparative example. FIG. 3A is a plan view of the semiconductor package, and FIG. 3B is a partial cross sectional view of the semiconductor package along a line C-C in FIG. 3A.

As illustrated in FIG. 3A and FIG. 3B, a semiconductor package 2X according to the comparative example differs from the semiconductor package 2 (refer to FIG. 2A and FIG. 2B), in that the semiconductor package 2X does not have an insulating substrate 40, and that one end of the first lead 21 and one end of the second lead 22 are positioned near the upper surface of the device mounting substrate 110.

In the semiconductor package 2X, protruding amounts of the first lead 21 and the second lead 22 from the upper surface 10a of the eyelet 10 are large. For this reason, heat caused by the operation of the light emitting element 120, transferred toward the eyelet 10 by the cooling element 100, is returned toward the light emitting element 120 via the first lead 21 and the second lead 22, which have a relatively high thermal conductivity and a relatively large volume. As a result, the cooling efficiency of the cooling element 100 deteriorates, thereby deteriorating the characteristics of the light emitting element 120 in some cases.

On the other hand, in the semiconductor package 2, the protruding amounts of the first lead 21 and the second lead 22 from the upper surface 10a of the eyelet 10 are reduced. In addition, in place of the leads, the first conductive layer 41 provided inside the first through hole 40x of the insulating substrate 40, and the second conductive layer 42 provided inside the second through hole 40y of the insulating substrate 40, extend to the upper surface of the insulating substrate 40 and connect to the wire member 130.

Because the thermal conductivity of the insulating substrate 40 is lower than the thermal conductivity of the first lead 21 and the second lead 22, it is possible to reduce the heat caused by the operation of the light emitting element 120, transferred toward the eyelet 10 by the cooling element 100, from being returned toward the light emitting element 120. In addition, because the first conductive layer 41 and the second conductive layer 42 are approximately several μm and thin, the first conductive layer 41 and the second conductive layer 42 essentially do not contribute to the return of the heat toward the light emitting element 120. As a result, the cooling efficiency of the cooling element 100 does not deteriorate, thereby enabling the light emitting element 120 to exhibit predetermined characteristics.

In a case where the first lead 21 and the second lead 22 are formed of kovar, for example, the thermal conductivity thereof is approximately 16.7 W/m·K. On the other hand, when the insulating substrate 40 is famed of glass, the thermal conductivity thereof is approximately 1.1 W/m·K, which is less than 1/10 that of kovar. For this reason, in the semiconductor package 2, it is possible to greatly reduce the return of the heat from the eyelet 10 toward the light emitting element 120.

When the protruding amounts of the first lead 21 inside the first through hole 40x and the second lead 22 inside the second through hole 40y are set large, the effect of reducing the return of the heat deteriorates. For this reason, the protruding amounts of the first lead 21 inside the first through hole 40x and the second lead 22 inside the second through hole 40y are preferably small within a range that enables reliable bonding between the first lead 21 and the first conductive layer 41, and between the second lead 22 and the second conductive layer 42.

In addition, by disposing the insulating substrate 40 on the upper surface 10a of the eyelet 10, and adjusting and selecting through hole diameter and through hole pitch (or interval) of the first through hole 40x and the second through hole 40y provided in the insulating substrate 40, and a dielectric constant of the insulating substrate 40, it is possible to match the characteristic impedances and reduce return loss. As a result, in the semiconductor package 2, high-frequency signals can be transmitted to the light emitting element 120 in an excellent manner.

In the semiconductor package 2X according to the comparative example, in a case where the diameter of the first lead 21 and the second lead 22 is 0.3 mm, and the pitch of the first lead 21 and the second lead 22 is 0.7 mm, a differential impedance of the first lead 21 and the second lead 22 becomes approximately 170Ω.

On the other hand, in the semiconductor package 2, in a case where the inside diameter of the first through hole 40x and the second through hole 40y is 0.45 mm, and the pitch of the first through hole 40x and the second through hole 40y is 0.7 mm, a differential impedance of the first lead 21 and the second lead 22 can be approximately 50Ω. The characteristic impedance can be adjusted by varying the material used for the insulating substrate 40, and the inside diameter and the pitch of the first through hole 40x and the second through hole 40y.

In addition, as may be seen from a comparison of the semiconductor package 2 illustrated in FIG. 2A and FIG. 2B and the semiconductor package 2X illustrated in FIG. 3A and FIG. 3B, the semiconductor package 2 can make the wire member 130 short compared to the semiconductor package 2X, thereby enabling a parasitic inductance to be reduced, which is also advantageous from a viewpoint of transmitting high-frequency signals. In the semiconductor package 2X, a length of the wire member 130 is approximately 0.65 mm, for example. In contrast, in the semiconductor package 2, the length of the wire member 130 is approximately 0.31 mm, for example, and can be less than or equal to one-half the length of the wire member 130 in the semiconductor package 2X.

Figure 4:
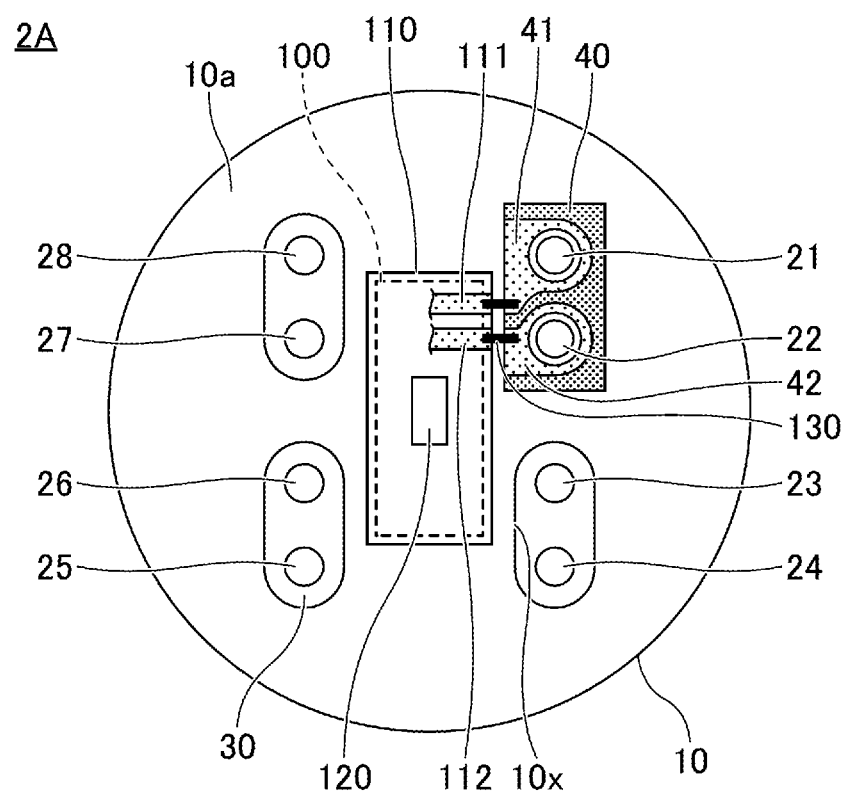
FIG. 4 is a diagram for explaining a modification of routing a first conductive layer and a second conductive layer.

Moreover, the wire member 130 can be made even shorter, by routing the first conductive layer 41 and the second conductive layer 42, which extend to the upper surface of the insulating substrate 40, so as to include portions opposing the interconnects 111 and 112, as in a semiconductor package 2A illustrated in FIG. 4. As a result, the parasitic inductance can further be reduced, thereby making it even more advantageous from the viewpoint of transmitting the high-frequency signals.

<Simulation>

Next, simulation results for the semiconductor packages 2, 2A, and 2X will be described in detail. Analyzing software ANSYS Electromagnetics Suite 2019 R3 was used for the simulation. The first lead 21 and the second lead 22 were made of kovar, and the diameter was 0.3 mm, while the pitch was 0.7 mm. A glass substrate having a relative dielectric constant of 5.5 was used for the insulating substrate 40, and the inside diameter of the first through hole 40x and the second through hole 40y was 0.45 mm, and the pitch of the first through hole 40x and the second through hole 40y was 0.7 mm.

Figure 5:
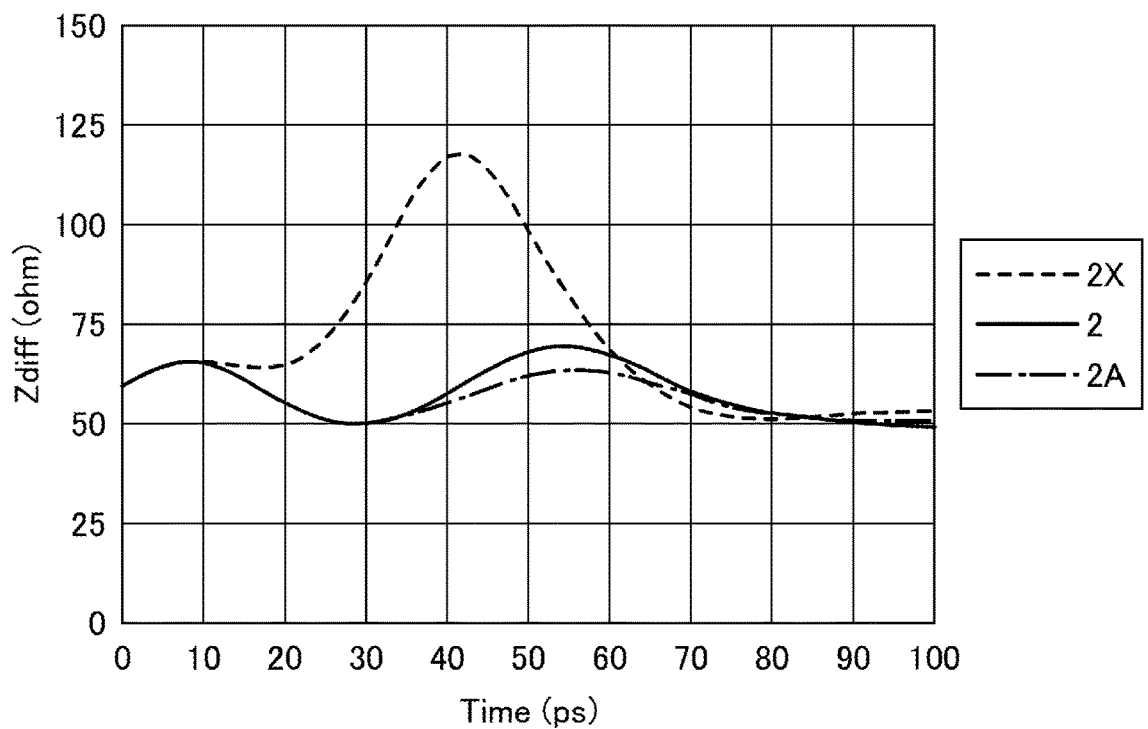
FIG. 5 is a diagram (part 1) for explaining simulation results.

When the characteristic impedance (Ω) was determined for the semiconductor packages 2, 2A, and 2X, results illustrated in FIG. 5 were obtained. In FIG. 5, the ordinate indicates a characteristic impedance Zdiff (ohm: Ω), and the abscissa indicates time (ps). As illustrated in FIG. 5, in the semiconductor package 2X having no insulating substrate 40, the characteristic impedance at 40 (ps) is approximately 120 (Ω). On the other hand, in the semiconductor packages 2 and 2A having the insulating substrate 40, the characteristic impedance is approximately 50 (Ω) throughout the indicated time range, and it was confirmed that a characteristic impedance close to an ideal characteristic impedance is obtainable.

Figure 6:
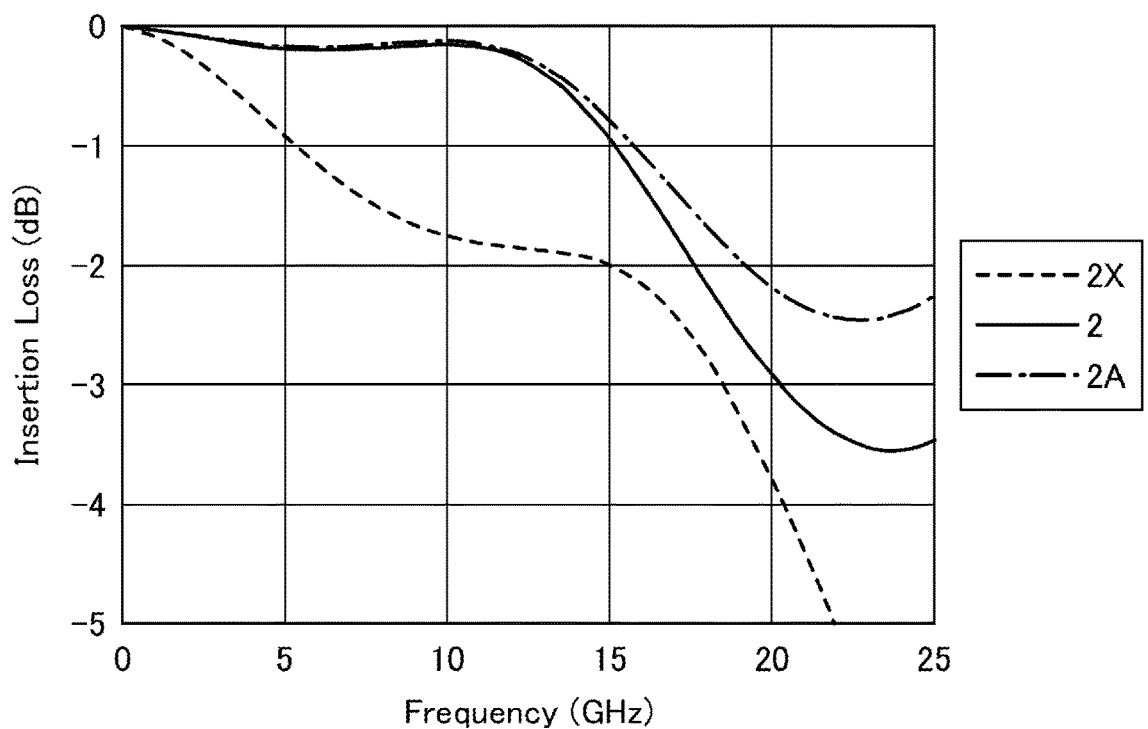
FIG. 6 is a diagram (part 2) for explaining the simulation results.
Figure 7:
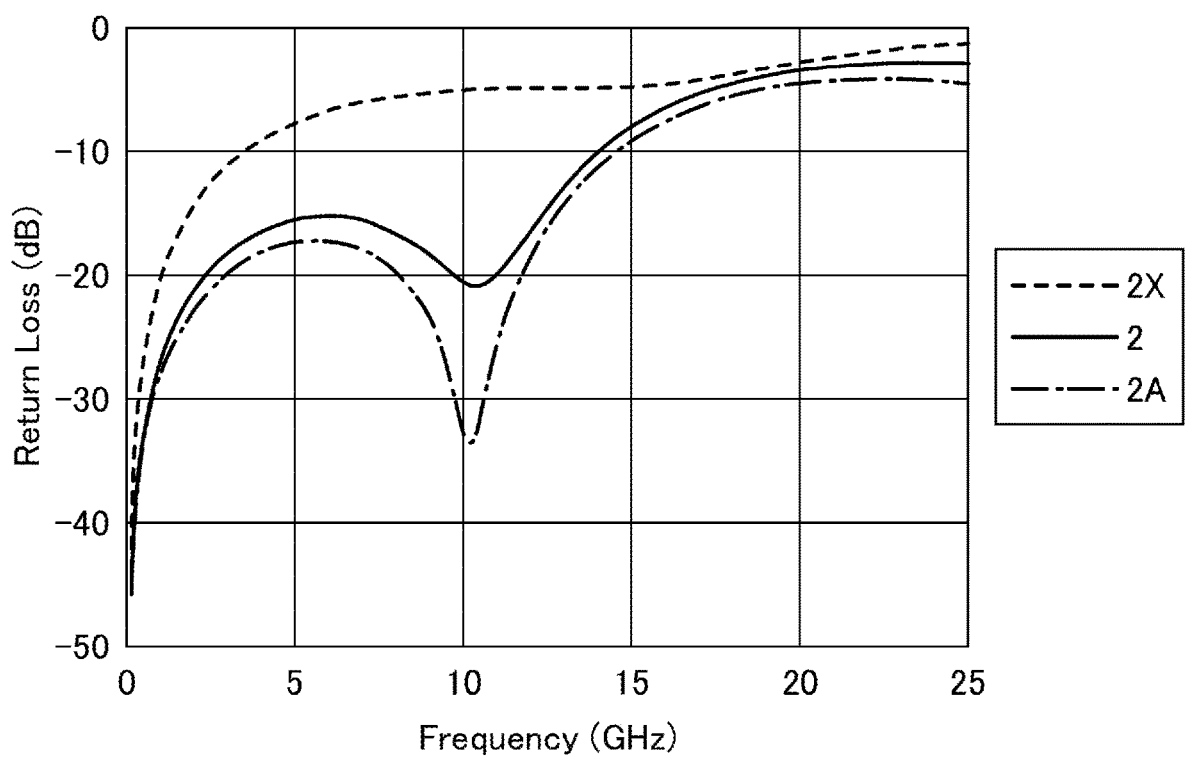
FIG. 7 is a diagram (part 3) for explaining the simulation results.

In addition, when the insertion loss (dB) and the return loss (dB) were determined for the semiconductor packages 2, 2A, and 2X, results illustrated in FIG. 6 and FIG. 7 were obtained. In FIG. 6, the ordinate indicates the insertion loss (dB), and the abscissa indicates the frequency (GHz). In FIG. 7, the ordinate indicates the return loss (dB), and the abscissa indicates the frequency (GHz). From FIG. 6 and FIG. 7, it can be seen that the insertion loss (dB) and the return loss (dB) up to approximately 15 GHz are significantly improved in the semiconductor packages 2 and 2A having the insulating substrate 40, when compared to the semiconductor package 2X having no insulating substrate 40. In particular, the semiconductor package 2A having the short wire member 130, the return loss (dB) near 10 GHz is significantly improved.

First Modification of First Embodiment

A first modification of the first embodiment is an example which enhances a shieldability (or shielding properties) of differential interconnects. In the first modification of the first embodiment, constituent elements that are the same as those of the first embodiment will be designated by the same reference numerals, and a description thereof may be omitted.

Figure 8:
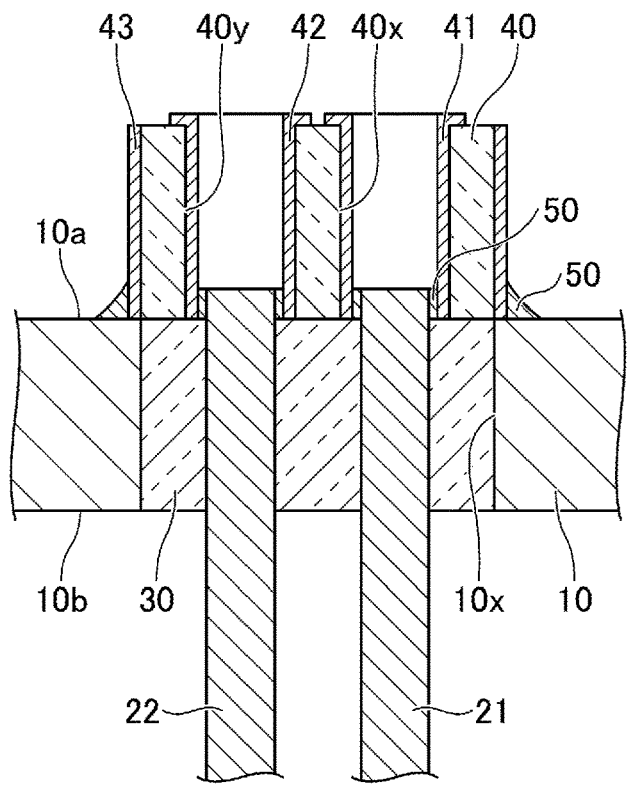
FIG. 8 is a diagram illustrating an example of the header for the semiconductor package according to a first modification of the first embodiment.

FIG. 8 is a diagram illustrating an example of the header for the semiconductor package according to a first modification of the first embodiment, and is a partial cross sectional view corresponding to FIG. 1A.

As illustrated in FIG. 8, a third conductive layer 43 can be famed on a side surface of the insulating substrate 40. The third conductive layer 43 can be formed of titanium, copper, nickel, gold, or the like, for example. By providing the third conductive layer 43 on the side surface of the insulating substrate 40, the shielding of the differential interconnects through the first through hole 40x and the second through hole 40y can be enhanced. The third conductive layer 43 is preferably electrically connected to the eyelet 10 which assumes the GND potential, by the conductive bonding material 50, such as solder or the like. In a case where the characteristic impedance decreases due to the provision of the third conductive layer 43 which assumes the GND potential, the material used for the insulating substrate 40, and the inside diameter and the pitch of the first through hole 40x and the second through hole 40y can be varied to adjust the characteristic impedance.

Second Modification of First Embodiment

A second modification of the first embodiment is an example using a single-end interconnect. In the second modification of the first embodiment, constituent elements that are the same as those of the first embodiment and the first modification will be designated by the same reference numerals, and a description thereof may be omitted.

Figure 9:
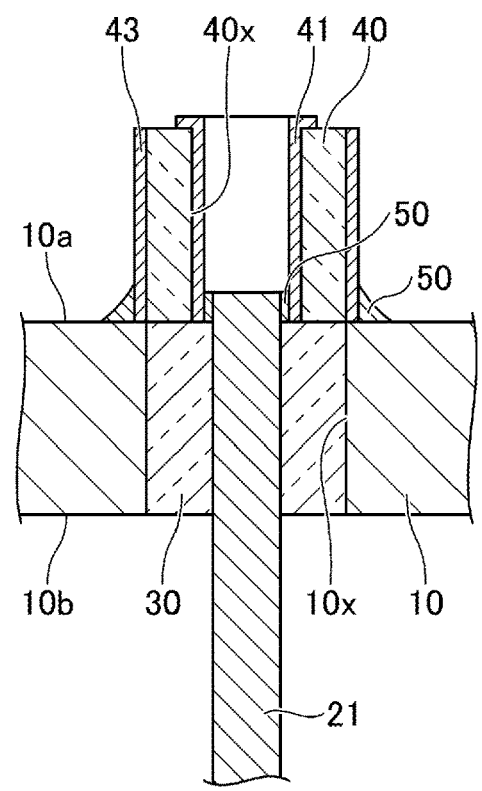
FIG. 9 is a diagram (part 1) illustrating an example of the header for the semiconductor package according to a second modification of the first embodiment.

FIG. 9 is a diagram (part 1) illustrating an example of the header for the semiconductor package according to a second modification of the first embodiment, and is a partial cross sectional view corresponding to FIG. 1A. In the example illustrated in FIG. 9, the insulating substrate 40 is provided with only one first through hole 40x, and the first lead 21 is the only signal lead. The connection between the first lead 21 and the first conductive layer 41 is the same as in the case of differential interconnects. The third conductive layer 43 is provided on the side surface of the insulating substrate 40, and the third conductive layer 43 is electrically connected to the eyelet 10 which assumes the GND potential, by the conductive bonding material 50, such as solder or the like.

Such a configuration ensures a predetermined characteristic impedance even in the case of the single-end interconnect, and can reduce the return of the heat from the eyelet 10 toward the light emitting element 120.

Figure 10A:
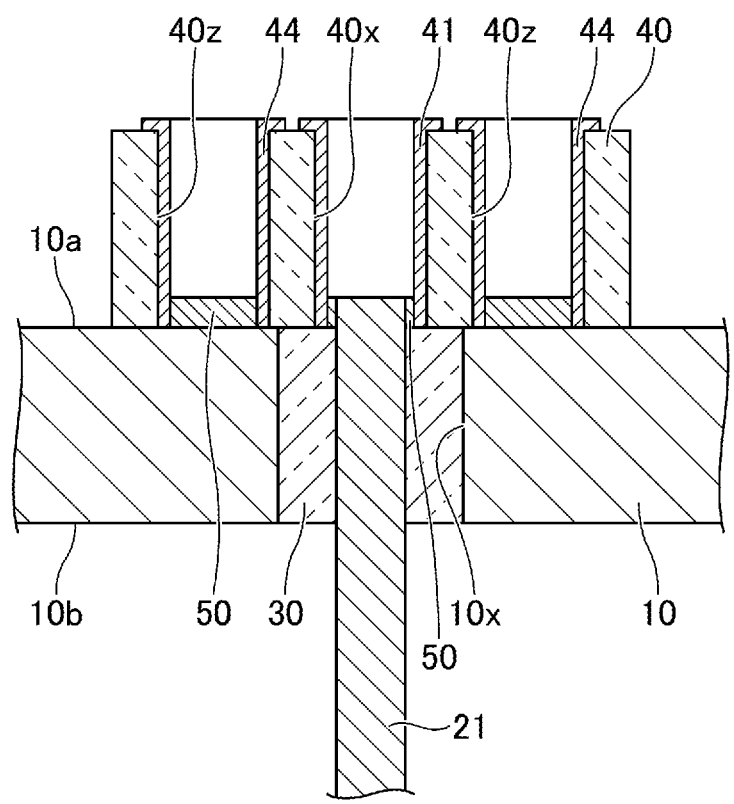
FIG. 10A and FIG. 10B are diagrams (part 2) illustrating the example of the header for the semiconductor package according to the second modification of the first embodiment.
Figure 10B:
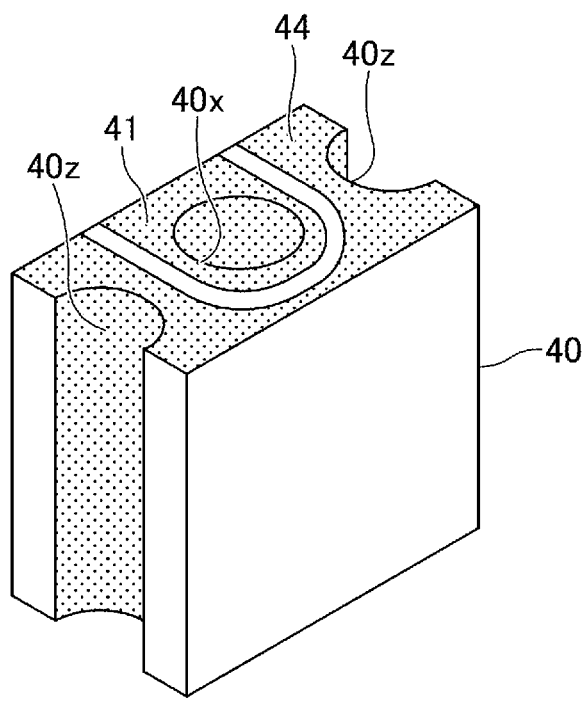

FIG. 10A and FIG. 10B are diagrams (part 2) illustrating the example of the header for the semiconductor package according to the second modification of the first embodiment. As illustrated in FIG. 10A, the insulating substrate 40 can be provided with one or more third through holes 40z for the GND, in addition to the first through hole 40x for the signal. A fourth conductive layer 44 is formed on an inner wall defining the third through hole 40z, and the fourth conductive layer 44 extends to the upper surface of the insulating substrate 40. The fourth conductive layer 44 can be formed of titanium, copper, nickel, gold, or the like, for example. The fourth conductive layer 44 is electrically connected to the eyelet 10 which assumes the GND potential, by the conductive bonding material 50, such as solder or the like. In the example illustrated in FIG. 10A, two third through holes 40z are provided, but only one third through hole 40z or three or more third through holes 40z can be provided.

In addition, as illustrated in FIG. 10B, the third through hole 40z provided in the insulating substrate 40 can have a semi-circular shape or the like in the plan view facing the side surface of the insulating substrate 40. The third through hole 40z illustrated in FIG. 10B has a shape corresponding to the third through hole 40z illustrated in FIG. 10A that is cut vertically through the center thereof, and the fourth conductive layer 44 formed on the inner wall defining the third through hole 40z is exposed at the side surface of the insulating substrate 40. In this configuration, the fourth conductive layer 44 formed on the inner wall defining the third through hole 40z can easily be electrically connected to the eyelet 10 which assumes the GND potential, by the conductive bonding material 50, such as solder or the like.

In the example illustrated in FIG. 10B, two third through holes 40z are provided, but only one third through hole 40z can be provided.

Third Modification of First Embodiment

In a third modification of the first embodiment, variation of the lead is illustrated. In the third modification of the first embodiment, constituent elements that are the same as those of the first embodiment, the first modification, and the second modification will be designated by the same reference numerals, and a description thereof may be omitted.

Figure 11A:
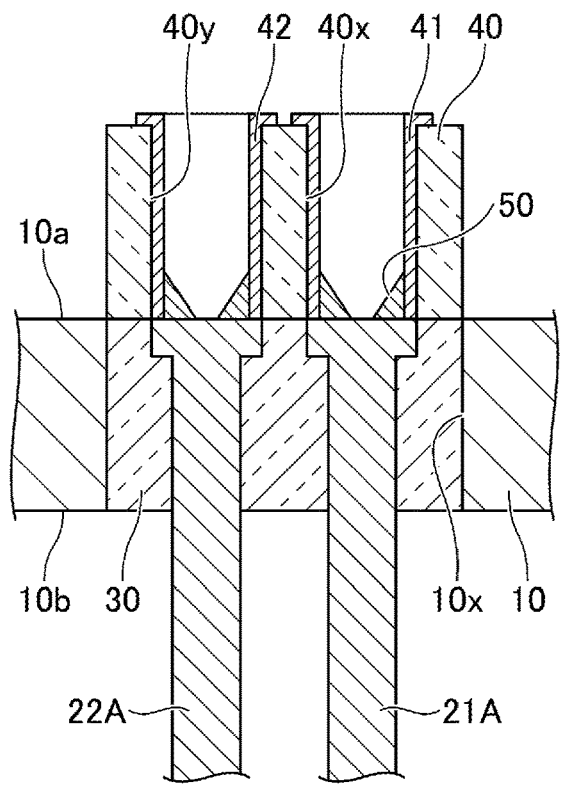
FIG. 11A and FIG. 11B are diagrams (part 1) illustrating an example of the header for the semiconductor package according to a third modification of the first embodiment.
Figure 11B:
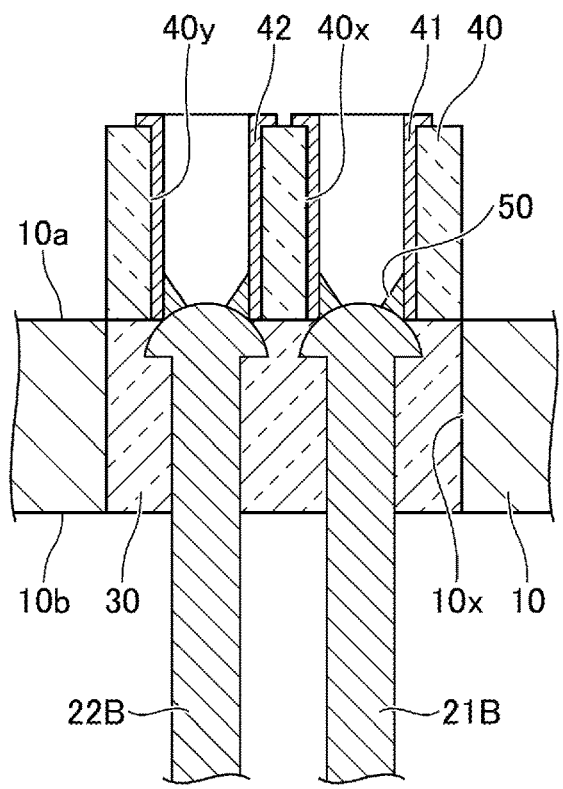

FIG. 11A and FIG. 11B are diagrams (part 1) illustrating an example of the header for the semiconductor package according to a third modification of the first embodiment. Leads, such as a first lead 21A and a second lead 22A illustrated in FIG. 11A, can have a nail-like shape that is widened at one end thereof closer to the insulating substrate 40. In the first lead 21A and the second lead 22A, a diameter of the widened portion is larger than the diameter of the first through hole 40x and the second through hole 40y, for example. In this case, the first lead 21A and the second lead 22A are not inserted inside the first through hole 40x and the second through hole 40y, respectively, but instead, upper surfaces of the first lead 21A and the second lead 22A are connected to the first conductive layer 41 by the conductive bonding material 50, such as solder or the like.

As illustrated in FIG. 11B, the widened end of the first lead 21B and the second lead 22B can be curved so as to be convex toward the insulating substrate 40. The widened end of the first lead 21B and the second lead 22B can have a hemispherical shape, for example. The widened end of the first lead 21B and the second lead 22B enters inside the first through hole 40x and the second through hole 40y, respectively. This configuration facilitates positioning of the first lead 21B and the second lead 22B relative to the first through hole 40x and second through hole 40y.

Figure 12A:
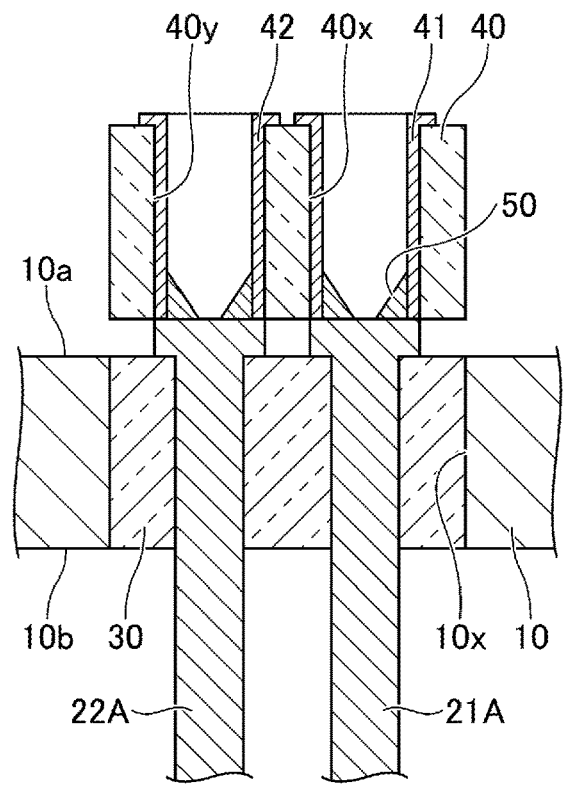
FIG. 12A and FIG. 12B are diagrams (part 2) illustrating the example of the header for the semiconductor package according to the third modification of the first embodiment.
Figure 12B:
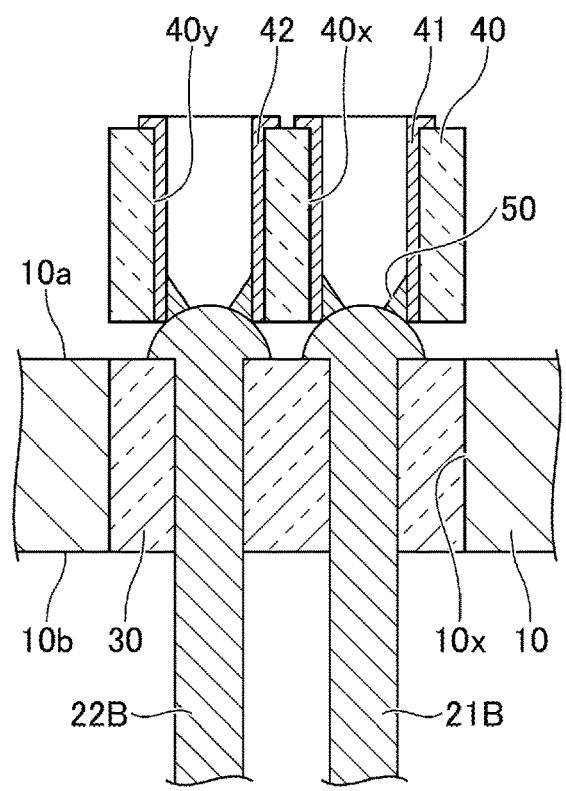

FIG. 12A and FIG. 12B are diagrams (part 2) illustrating the example of the header for the semiconductor package according to the third modification of the first embodiment. As illustrated in FIG. 12A and FIG. 12B, a gap can be provided between the upper surface 10a of the eyelet 10 and a lower surface of the insulating substrate 40. The gap between the upper surface 10a of the eyelet 10 and the lower surface of the insulating substrate 40 can be in a range of approximately 0 mm to approximately 0.3 mm, for example. In a case where a parasitic capacitance is observed at a connecting portion between each lead and each of the first conductive layer 41 and the second conductive layer 42, the parasitic capacitance can be reduced by providing the gap as illustrated in FIG. 12A and FIG. 12B.

While the preferred embodiments have been described in detail above, various variations, modifications, and substitutions can be made to the embodiments and modifications described above without departing from the scope of the present invention.

For example, in a case where the insulating substrate 40 is famed of a material having a thermal conductivity lower than the thermal conductivity of each lead, a ceramic substrate or the like can be used as the insulating substrate 40. However, the effect of reducing the return of the heat from the eyelet 10 toward the light emitting element 120 is greater in the case of a glass substrate having a thermal conductivity lower than the thermal conductivity of the ceramic substrate. From a viewpoint of controlling the characteristic impedance, the glass substrate and the ceramic substrate exhibit approximately the same effect. In addition, in a case where a material subjectable to a low-temperature heat treatment, such as silver paste or the like, is used as the conductive bonding material 50, a resin substrate, such as a glass epoxy substrate or the like, can be used as the insulating substrate 40. In this case, it is preferable to select a material having a low thermal conductivity in a direction perpendicular to the upper surface 10a of the eyelet 10.

Accordingly to each of the embodiments and modifications described above, it is possible to provide a header for a semiconductor package, having a configuration that takes into consideration the characteristic impedance and cooling performance of the semiconductor package.

Although the modifications of the embodiments are numbered with, for example, "first," "second," or "third," the ordinal numbers do not imply priorities of the modifications of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A header for a semiconductor package, comprising:
    an eyelet having a through hole penetrating the eyelet from an upper surface to a lower surface of the eyelet;
    a first lead inserted inside the through hole; and
    an insulating substrate disposed on the upper surface of the eyelet, and provided with a first through hole at a position overlapping one end of the first lead in a plan view, wherein:
    the insulating substrate has a thermal conductivity lower than a thermal conductivity of the first lead,
    a first conductive layer is formed on an inner wall defining the first through hole, and the first conductive layer extends to an upper surface of the insulating substrate to make contact with and cover a portion of the upper surface of the insulating substrate,
    the one end of the first lead is electrically connected to the first conductive layer, and
    a space is provided above the one end of the first lead inside the first through hole.

2. The header for the semiconductor package as claimed in claim 1, further comprising:
    a second lead adjacent to the first lead, wherein
    the thermal conductivity of the insulating substrate is lower than thermal conductivities of the first lead and the second lead,
    the insulating substrate is provided with a second through hole at a position overlapping one end of the second lead in the plan view,
    a second conductive layer is formed on an inner wall defining the second through hole, and the second conductive layer extends to the upper surface of the insulating substrate,
    the one end of the second lead is electrically connected to the second conductive layer, and
    a space is provided above the one end of the second lead inside the second through hole.

3. The header for the semiconductor package as claimed in claim 1, further comprising:
    a third conductive layer formed on a side surface of the insulating substrate, wherein
    the third conductive layer is electrically connected to the eyelet.

4. The header for the semiconductor package as claimed in claim 1, wherein
    the insulating substrate is provided with a third through hole,
    a fourth conductive layer is formed on an inner wall defining the third through hole, and
    the fourth conductive layer is electrically connected to the eyelet.

5. The header for the semiconductor package as claimed in claim 4, wherein the fourth conductive layer formed on the inner wall defining the third through hole is exposed at a side surface of the insulating substrate.

6. The header for the semiconductor package as claimed in claim 1,
    wherein the first lead is widened at the one end thereof.

7. The header for the semiconductor package as claimed in claim 6, wherein
    the one end of the first lead is curved so as to be convex toward the insulating substrate, and
    a portion of the one end of the first lead enters inside the first through hole.

8. The header for the semiconductor package as claimed in claim 6, wherein a gap is formed between the upper surface of the eyelet and a lower surface of the insulating substrate.

9. The header for the semiconductor package as claimed in claim 1, wherein the insulating substrate is a glass substrate.

10. The header for the semiconductor package as claimed in claim 2, wherein the second conductive layer extends to the upper surface of the insulating substrate to make contact with and cover a portion of the upper surface of the insulating substrate.

11. The header for the semiconductor package as claimed in claim 10, wherein a portion of the second conductive layer extending to the upper surface of the insulating substrate has an upper surface configured to connect to a wire member electrically connected to an external interconnect.

12. A semiconductor package comprising:
    a header for a semiconductor package, including:
        an eyelet having a through hole penetrating the eyelet from an upper surface to a lower surface of the eyelet,
        a first lead inserted inside the through hole, and
        an insulating substrate disposed on the upper surface of the eyelet, and provided with a first through hole at a position overlapping one end of the first lead in a plan view, wherein the insulating substrate has a thermal conductivity lower than a thermal conductivity of the first lead, a first conductive layer is formed on an inner wall defining the first through hole, and the first conductive layer extends to an upper surface of the insulating substrate, the one end of the first lead is electrically connected to the first conductive layer, and a space is provided above the one end of the first lead inside the first through hole;
    a cooling element disposed on the upper surface of the eyelet;
    a substrate disposed on the cooling element; and
    a light emitting element mounted on the substrate, wherein:

an interconnect electrically connecting to the light emitting element is formed on the substrate, and the interconnect is electrically connected to a portion of the first conductive layer extending to the upper surface of the insulating substrate via a wire member.

13. The semiconductor package as claimed in claim 12, wherein the header further includes a second lead adjacent to the first lead, the thermal conductivity of the insulating substrate is lower than thermal conductivities of the first lead and the second lead, the insulating substrate is provided with a second through hole at a position overlapping one end of the second lead in the plan view, a second conductive layer is formed on an inner wall defining the second through hole, and the second conductive layer extends to the upper surface of the insulating substrate, the one end of the second lead is electrically connected to the second conductive layer, and a space is provided above the one end of the second lead inside the second through hole.

14. The semiconductor package as claimed in claim 12, wherein the header further includes a third conductive layer formed on a side surface of the insulating substrate, and the third conductive layer is electrically connected to the eyelet.

15. The semiconductor package as claimed in claim 12, wherein the insulating substrate is provided with a third through hole, a fourth conductive layer is formed on an inner wall defining the third through hole, and the fourth conductive layer is electrically connected to the eyelet.

16. The semiconductor package as claimed in claim 15, wherein the fourth conductive layer formed on the inner wall defining the third through hole is exposed at a side surface of the insulating substrate.

17. The semiconductor package as claimed in claim 12, wherein the first lead is widened at the one end thereof.

18. The semiconductor package as claimed in claim 17, wherein the one end of the first lead is curved so as to be convex toward the insulating substrate, and a portion of the one end of the first lead enters inside the first through hole.

19. The semiconductor package as claimed in claim 17, wherein a gap is formed between the upper surface of the eyelet and a lower surface of the insulating substrate.

20. The semiconductor package as claimed in claim 12, wherein the insulating substrate is a glass substrate.

\* \* \* \* \*